United States Patent [19]

Sakurai et al.

[11] Patent Number: 5,229,723
[45] Date of Patent: Jul. 20, 1993

[54] MAGNETIC FIELD GENERATING DEVICE FOR MRI

[75] Inventors: Hideya Sakurai; Masaaki Aoki; Youichi Ohnishi, all of Mishima, Japan

[73] Assignee: Sumitomo Special Meter Co., Ltd., Osaka, Japan

[21] Appl. No.: 550,081

[22] Filed: Jul. 9, 1990

[30] Foreign Application Priority Data

Jul. 7, 1989 [JP] Japan .................... 1-176054

[51] Int. Cl.⁵ ............................................. G01R 33/20
[52] U.S. Cl. ..................................................... 324/319
[58] Field of Search .................... 324/318, 319, 320; 335/297, 298, 301, 304, 306

[56] References Cited

U.S. PATENT DOCUMENTS

| | | | |
|---|---|---|---|
| 4,644,313 | 2/1987 | Miyajima | 335/304 |
| 4,672,346 | 6/1987 | Miyamoto et al. | 335/298 |
| 4,679,022 | 7/1987 | Miyamoto et al. | 324/319 |
| 4,682,111 | 7/1987 | Hughes | 324/320 |
| 4,723,116 | 2/1988 | Müller et al. | 324/320 |
| 4,777,464 | 11/1988 | Takabatashi et al. | 324/318 |
| 4,818,966 | 4/1989 | Miyamoto et al. | 335/297 |
| 4,827,235 | 5/1989 | Inomata et al. | 335/297 |
| 4,937,545 | 6/1990 | Chaillout et al. | 324/318 |
| 4,943,774 | 7/1990 | Breneman et al. | 324/318 |
| 5,003,276 | 3/1991 | Sarwinski et al. | 335/304 |

*Primary Examiner*—Michael J. Tokar
*Attorney, Agent, or Firm*—Watson, Cole, Grindle & Watson

[57] ABSTRACT

Disclosed is an MRI-dedicated magnetic field generating device for generating magnetic fields within an air gap, including: a pair of permanent magnet assemblies opposite to each other to form an air gap therebetween; yokes for magnetically linking the permanent magnet assemblies; and magnetic pole pieces fixed to air-gap-confronting surfaces thereof. Based on this construction, intensities of the magnetic fields are increased by disposing a plurality of magnetic material segments on the same circle or a concentric circle on the confronting surface thereof or decreased by disposing a plurality of permanent magnet segments having a magnetizing direction opposite to that of the permanent magnet assemblies on the same circle or the concentric circle on the confronting surface thereof; or alternatively both the magnetic material segments and the permanent magnet segments are disposed on the same circle or the concentric circle.

11 Claims, 8 Drawing Sheets

Fig. 1a
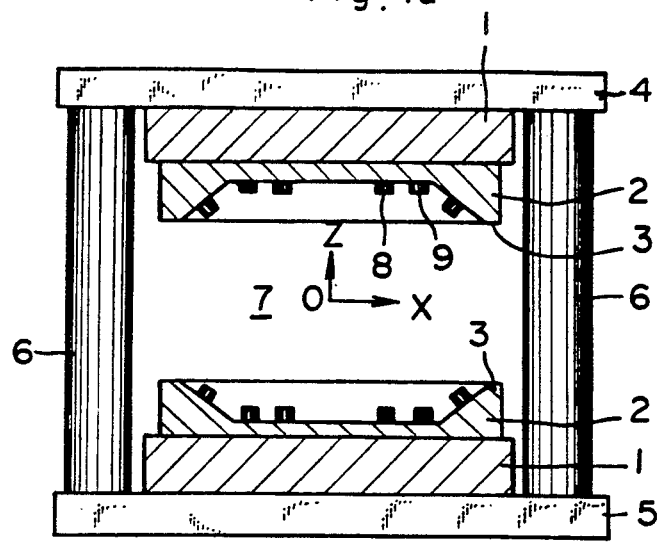
Fig. 1b
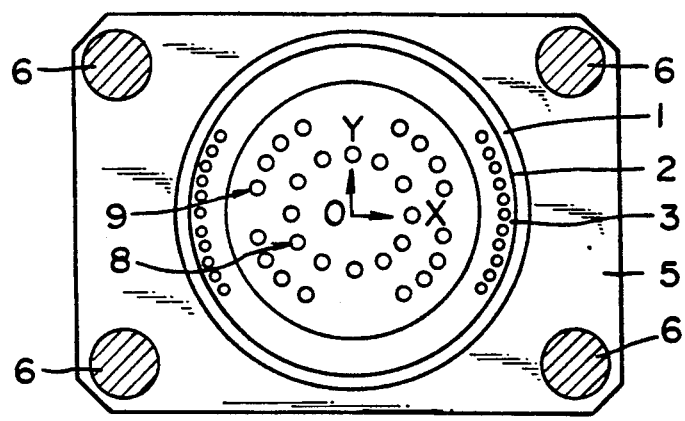
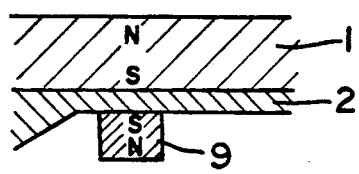
Fig. 1c
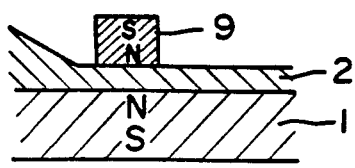

Fig. 1g
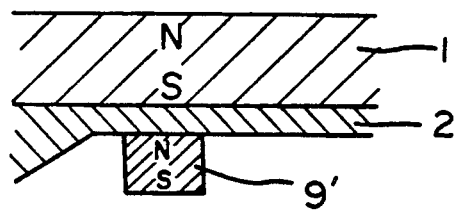
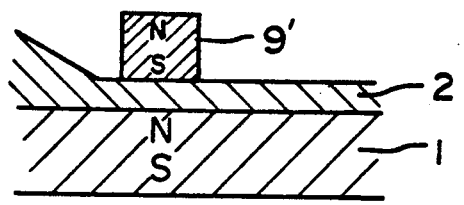

MAGNETIC FIELD GENERATING DEVICE FOR MRI

BACKGROUND OF THE INVENTION

1. Field of the Invention

The present invention is directed generally to an improvement of a magnetic field generating device employing permanent magnets and used for a magnetic resonance imaging device (hereinafter abbreviated to MRI) for a medical-purpose, and more particularly, to a magnetic field generating device for MRI, the arrangement being such that a plurality of magnetic field adjusting magnetic material segments and/or a plurality of magnetic field adjusting permanent magnet segments having a magnetizing direction opposite to that of permanent magnet assemblies are disposed on the same circles or concentric circles on magnetic pole piece surfaces standing vis-a-vis with an air gap to thereby eliminate a non-uniformity of the magnetic fields which is ascribed particularly to a difference in configuration between yokes in a magnetic circuit.

2. Description of the Prior Art

The medical-purpose magnetic resonance imaging device (MRI) is a tomograph capable of obtaining a sectional image of an object by inserting a part of or all of a subject to be examined into an air gap of a magnetic field generating device for generating intensive magnetic fields and depicting even properties of the tissues thereof.

The magnetic field generating device for MRI requires an air gap enough to insert a part or all of the subject. Besides, it is typically required that an intensive and uniform magnetic field exhibiting an accuracy on the order of 0.005-2.0T and $1 \times 10^{-4}$ or less be created in an imaging visual field within the air gap.

One known arrangement of the magnetic field generating device for MRI is that magnetic pole pieces (2), (2) opposite to each other are, as illustrated in FIG. 1, fixed to one ends of a pair of permanent magnet assemblies (1), (1) which employ Fe-B-R series magnets; tabular yokes (4) and (5) are fixed to the other ends thereof and linked to each other via a four lengths of columnar yokes (6); and a static magnetic field is generated within an air gap (7) defined by the magnetic pole pieces (2), (2).

Based on the construction given above, with the intention of creating more stable and uniform magnetic field, for instance, there has been proposed a magnetic field generating device (Japanese Utility Model Laid-Open Publication No. 60-166110), wherein annular projections (3) are shaped on the confronting surfaces of the magnetic pole pieces; or alternatively convex projections are formed at the centers of the confronting surfaces of the magnetic pole pieces.

On the basis of the above-described construction, there has also been proposed a magnetic field generating device (Japanese Utility Model Laid-Open Publication No. 62-112106), wherein the annular projections are provided on the confronting surfaces of the magnetic pole pieces, and a single or a plurality of magnetic field adjusting pieces made of a magnetic material are secured to predetermined portions of the annular projections.

The uniformity of the magnetic field of the magnetic field generating device is, as discussed above, required to have an accuracy on the order of $1 \times 10^{-4}$ within a predetermined space but is greatly influenced depending on configurations of the yokes or placement thereof in a magnetic circuit and, in particular, greatly influenced by configurations of the magnetic pole pieces.

For example, as in the case of FIG. 1, not only the configurations of the magnetic pole pieces but also the rectangular tabular yokes (4) and (5) and the columnar yokes (6) exert large influences on the uniformity of the magnetic field. The rectangular tabular yokes (4) and (5) intensity the magnetic field acting in a direction Y rather than in a direction X. whereas the columnar yokes (6) weaken the magnetic field acting in a columnar direction.

A high uniformity is obtained by providing the annular projections on the magnetic pole pieces. If an intensity of the magnetic field is locally increased on the magnetic pole piece according to the configurations and placement of the above-mentioned composing members of the magnetic field so as to provide a higher uniformity, iron pieces may be bonded thereto, as is disclosed in Japanese Utility Model Laid-Open Publication No. 62-112106. An extremely high uniformity can not, however, be obtained simply by bonding the iron pieces to the magnetic pole pieces.

Whereas in an attempt to locally decrease the intensity of the magnetic field, a thinkable measure is to reduce the number of magnetic pole pieces concerned disposed on the portions, i.e., to form holes. It is, however, difficult to reprocess the magnetic pole pieces such as boring after the fabrication has been performed. Desired effects are not necessarily be acquired.

SUMMARY OF THE INVENTION

It is a primary object of the present invention to provide a magnetic field generating device for MRI which is capable of locally increasing or decreasing an intensity of a magnetic field within a predetermined air gap by a predetermined quantity without reprocessing magnetic pole pieces and obtaining the magnetic field exhibiting an extremely high uniformity.

The inventors have made various studies of the magnetic field generating device which can locally increase or decrease the magnetic field intensity in a desired air gap without any requirement to rearrange the magnetic pole pieces and discovered that in accordance with the degree of the magnetic field intensity measured in the respective concentric circles which are defined by a plurality of horizontal planes traversing a spherical air gap assumed in the central portion of the air gap formed between the magnetic pole pieces, if the magnetic material segments and/or permanent magnet segments having the same magnetizing direction as that of the prmanent magnet assemblies are arranged at the predetermined portions on the surfaces of the magnetic pole pieces confronting the air gap so as to increase the magnetic field intensity and the permanent magnet segments having the magnetizing direction opposite to that of the permanent magnet assemblies are arranged at the predetermined portions on the surfaces of the magnetic pole pieces confronting the air gap so as to decrease the magnetic field intensity, the arrangements can make readily a fine adjustment of the magnetic field, thereby enabling to provide the magnetic field of a considerably high uniformity.

More precisely, the inventors have found from various experiments that the most suitable portions for a adjusting the magnetic field intensity on the circumference of the circle formed by the horizontal plane traversing the above-mentioned spherical air gap are located on the surfaces of the magnetic pole pieces confronting the air gap correspondingly to the respective circumferential portions. The magnetic field intensity on the circumference of the circle formed by horizontally traversing the spherical air gap can be adjusted by arranging the magnetic material segments and/or permanent magnet segments on the circumference of the same circle on the surface of the magnetic pole piece. Moreover, in order to equalize the average value of the magnetic field intensity on the respective circumferences of the circles formed by horizontally traversing the spherical air gap it is effective to arrange the magnetic material segments and/or permanent magnet segments concentrically on the same circle on the surface of the magnetic pole pieces.

To accomplish the above-described object, according to one aspect of the invention, there is provided an MRI-dedicated magnetic field generating device for generating magnetic fields within an air gap, comprising: a pair of permanent magnet assemblies disposed vis-a-vis with each other to form an air gap therebetween; yokes for magnetically linking the permanent magnet assemblies; and magnetic pole pieces fixed to air-gap-confronting surfaces of the permanent magnet assemblies, characterized in that intensities of the magnetic fields are increased by disposing a plurality of magnetic material segments and/or a plurality of permanent magnet segments for adjusting the magnetic field intensity and having the same magnetizing direction as that of the permanent magnet assemblies for adjusting the magnetic fields on the same circle or a concentric circle on the air-gap-confronting surface of the magnetic pole piece or decreased by disposing a plurality of magnetic field adjusting permanent magnet segments, whose magnetizing direction is opposite to that of the permanent magnet assemblies, on the same circle or the concentric circle on the air-gap-confronting surface of the magnetic pole piece; or alternatively both the magnetic field adjusting magnetic material segments and the magnetic field adjusting permanent magnet segments are disposed on the same circle or the concentric circle.

According to the present invention, a magnetic circuit may take any constructions on condition that the pair of permanent magnet assemblies disposed vis-a-vis with each other for form the air gap therebetween are magnetically linked via the yokes to each other, and the magnetic pole pieces are fixed to the air-gap-confronting surfaces of the respective permanent magnet assemblies. Preferably, the constructions are adequately selected depending on magnetic properties and configurational dimensions of the permanent magnets, configurational dimensions of the yokes and a size of the air gap required.

According to the present invention, the magnetic pole pieces are allowed to take arbitrary configurations and forms, wherein for the purpose of improving the uniformity of the magnetic fields the magnetic pole piece as a disk-like magnetic body may be formed with an annular projection assuming a trapezoidal or rectangular shape in section on an outer periphery thereof and with a convex projection assuming a trapezoidal shape in section at the center of the magnetic pole piece itself. In addition, adequately selectable materials for the magnetic pole piece include bulks of a variety of magnetic materials, solidified magnetic powder, a laminate assuming a concentric circle and composites of heterogeneous materials.

Usable permanent magnets of the magnet assemblies employed for the aforementioned magnetic circuit are ferrite magnets, Alnico series magnets and rare earth cobalt series magnets. In particular, there is employed a light rare earth element group which is abundant in terms of resources, wherein Nd and Pr serving as R are dominant. Used also are Fe-B-R series permanent magnets exhibiting an extremely high energy product of 30 MGOe or more with the main components being B and Fe. By virtue of using those magnets, the magnetic circuit can remarkably be miniaturized.

Configurations and dimensions of the magnetic material segments and the permanent magnet segments are properly selectable, as will be mentioned later, depending on conditions under which the magnetic fields are adjusted.

BRIEF DESCRIPTION OF THE DRAWINGS

Other objects and advantages of the present invention will become apparent during the following discussion taken in conjunction with the accompanying drawings, in which:

FIG. 1a is a vertical sectional view of assistance in explaining a magnetic field generating device in one embodiment of the present invention;

FIG. 1b is cross-sectional explanatory view thereof;

FIG. 1c is a partially enlarged explanatory view of FIG. 1a;

FIGS. 1d to 1g are partially enlarged explanatory views, each showing other embodiment of FIG. 1c.

DESCRIPTION OF THE PREFERRED EMBODIMENTS

Figure 1D:
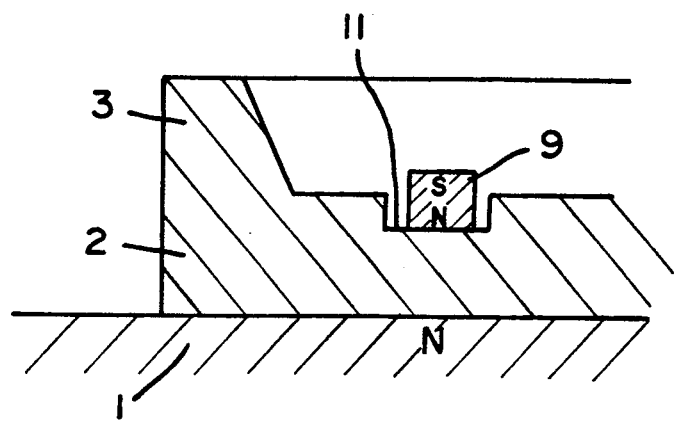
Figure 1E:
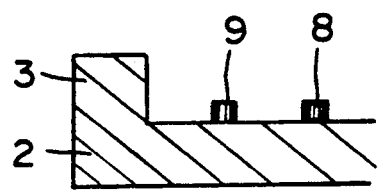

FIG. 1a is a vertical sectional explanatory view of a magnetic field generating device, showing one embodiment of the present invention. FIG. 1b is a cross-sectional explanatory view thereof. FIG. 1c is a partially enlarged explanatory view of FIG. 1a. FIGS. 1d to 1g are sectional views illustrating other embodiments.

Figure 2:
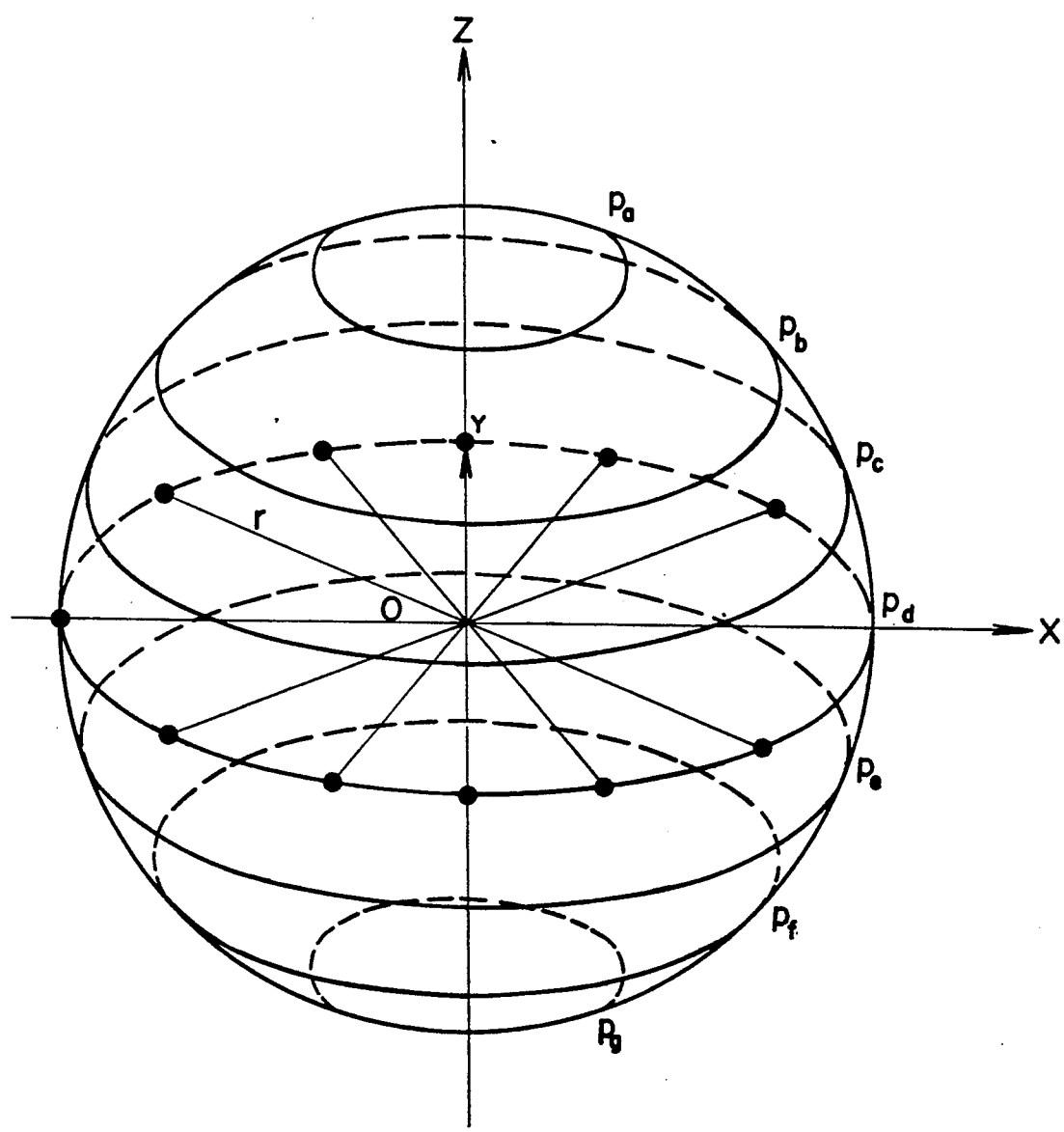
FIG. 2 is a perspective view, illustrating an air gap, of assistance in explaining a method of measuring a magnetic field within an air space of a spherical body of the magnetic field generating device.

FIG. 2 is a perspective view, depicting an air gap, of assistance in explaining a method of measuring a magnetic field within an air space of a spherical body of the magnetic field generating device.

A descriptive emphasis will herein be placed on a magnetic field generating device constructed in such a way that magnetic pole pieces (2), (2) each formed with an annular projection (3) on its peripheral edge are, as illustrated in FIG. 1, fixed vis-a-vis with each other to one ends of a pair of permanent magnet assemblies (1), (1) employing Fe-B-R series magnets; rectangular tabular yokes (4) and (5) are fixed to other ends thereof and linked to each other via four lengths of columnar yokes (6) provided at four corners, whereby a static magnetic field is generated within an air gap (7) defined by the magnetic pole pieces (2), (2).

In the air gap (7) of the thus constructed magnetic field generating device, there is set an air space of a spherical volume having a predetermined radius r from a center (0) thereof. As depicted in FIG. 2, intensities of the magnetic fields at a plurality of points obtained by equally dividing the circumferences on which a predetermined number—e.g., seven in this case—of horizontal planes (Pa to Pg) intersect the spherical body air space at predetermined angles about an axis Z while these horizontal planes (Pa to Pg) traverse the spherical body, thus examining the variety of the intensities of the magnetic fields on the circumferences of the respective horizontal planes (Pa to Pg). (See FIG. 6)

The portions where the magnetic field intensity is adjusted, i.e. increased or decreased can be set on the respecive magnetic pole pieces (2) (2) correspondingly to a plurality of points on the respective circumferences of the horizontal planes (Pa–Pg), each of the points of which where the magnetic field intensity is measured. As shown in FIG. 1b, either the magnetic material segments (8) or the permanent magnet segments (9) having the magnetizing direction opposite to that of the respective magnetic pole pieces (2) (2) (see FIG. 1c) are arranged on the magnetic pole pieces (2) (2) so as to make the distribution of the magnetic field unifornm in accordance with the above-mentioned measurement of the magnetic field intensity.

Further, the permanent magnet pieces (9') (see FIG. 1g) having the same magnetizing direction as that of the permanent magnet assemblies can be arranged in combination with the magnetic material segments (8), because such combined arrangement provides the same effect for adjusting the magnetic field intensity as provided by the arrangement of the magnetic material segments (8) only.

The adjustment of the magnetic field may involve appropriate selections of the number of horizontal planes or the dividing angle in accordance with a required uniformity of the magnetic fields.

The magnetic material segments (8) or the permanent magnet segments (9) secured onto the respective magnetic pole pieces (2), (2) are therefore arranged on a concentric circle, with the result that portions exhibiting a partially higher density of magnetic flux can be diminished, or reversely portions exhibiting a partially lower density thereof can be enlarged without reprocessing the magnetic pole piece (2). Besides, a subtle adjustment of the uniformity becomes practicable.

The permanent magnet segments are bonded to the portions having the partially higher density of the magnetic flux on the magnetic pole piece (2) but may, if necessary, be fitted, as illustrated in FIG. 1(d), in a recessed groove (11).

Figure 1F:
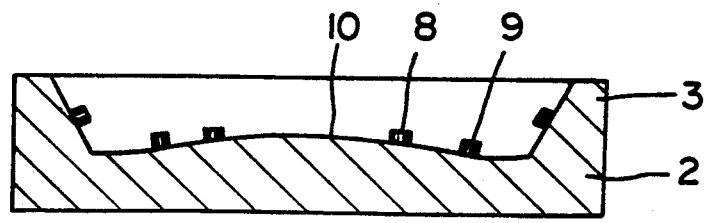

The foregoing descriptions are related to the embodiments shown in FIGS. 1a to 1d and FIG. 1g wherein the annular projection is of a trapezoidal shape in cross-section. Even in the case where the annular projection is of a rectangular shape in cross-section, as shown in FIG. 1f, there can provide the same effect as provided by the embodiments shown in FIGS. 1a to 1d and FIG. 1g. Furthermore, when the magnetic pole pieces (2) (2) are formed convexedly at their central portions (10), as shown in FIG. 1f, in addition to the provision of the annular projection (3), the uniformity of the magnetic field can be further improved.

Configurations of the magnetic material segments or the permanent magnet segments may arbitrarily be adopted. In the case of, e.g., a disk-like shape or a columnar shape, a diameter and a height are properly selectable to make the magnetic field distribution uniform on the basis of the above-mentioned measurement of the magnetic field intensities, whereby the hyperfine adjustment of the magnetic fields can be effected.

The material can also arbitrarily be adopted. Particularly, the material for the permanent magnet segments (9), (9') may preferably be selected relying on the magnetic property of the permanent magnet assemblies (1).

EXAMPLES

Figure 4:
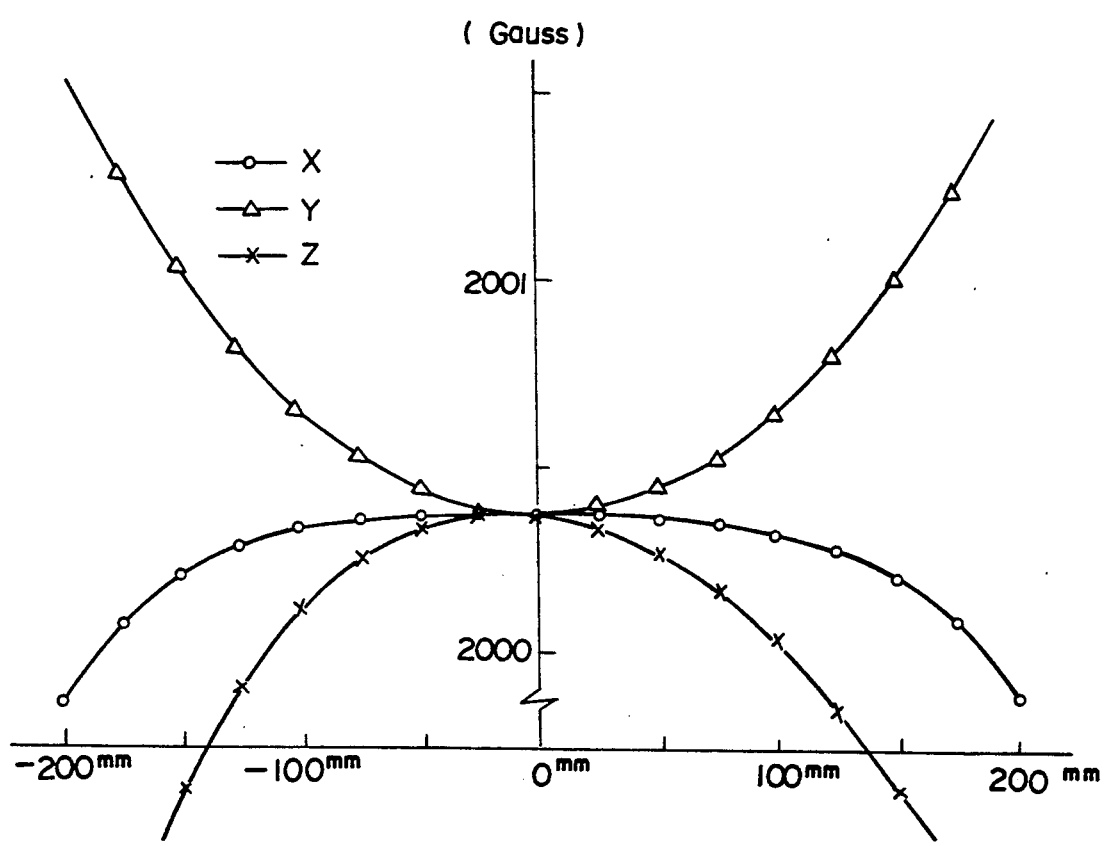
FIG. 4 is a graphic chart showing the measured results of the magnetic fields on the axes X, Y and Z within the air gap of the spherical body in the magnetic field generating device before employing magnetic pole pieces according to the present invention which is shown in FIG. 1, the results being expressed by the azimuths and the magnetic field intensities.

FIG. 4 shows results of measuring intensities of the magnetic field acting in directions of the axes X, Y and Z within the air gap (7) in a magnetic field generating device depicted in FIG. 1, wherein a magnetic pole piece formed with a convex projection having a diameter of 300 mm and a height of 1.0 mm and an annular projection having an outside diameter of 1100 mm, an inside diameter of 900 mm and a height of 40 mm is disposed by using an Fe-B-R series permanent magnet exhibiting (BH)max of 35MGOe at a normal temperature, and a confronting distance between the magnetic pole pieces is set to 500 mm.

Figure 6:
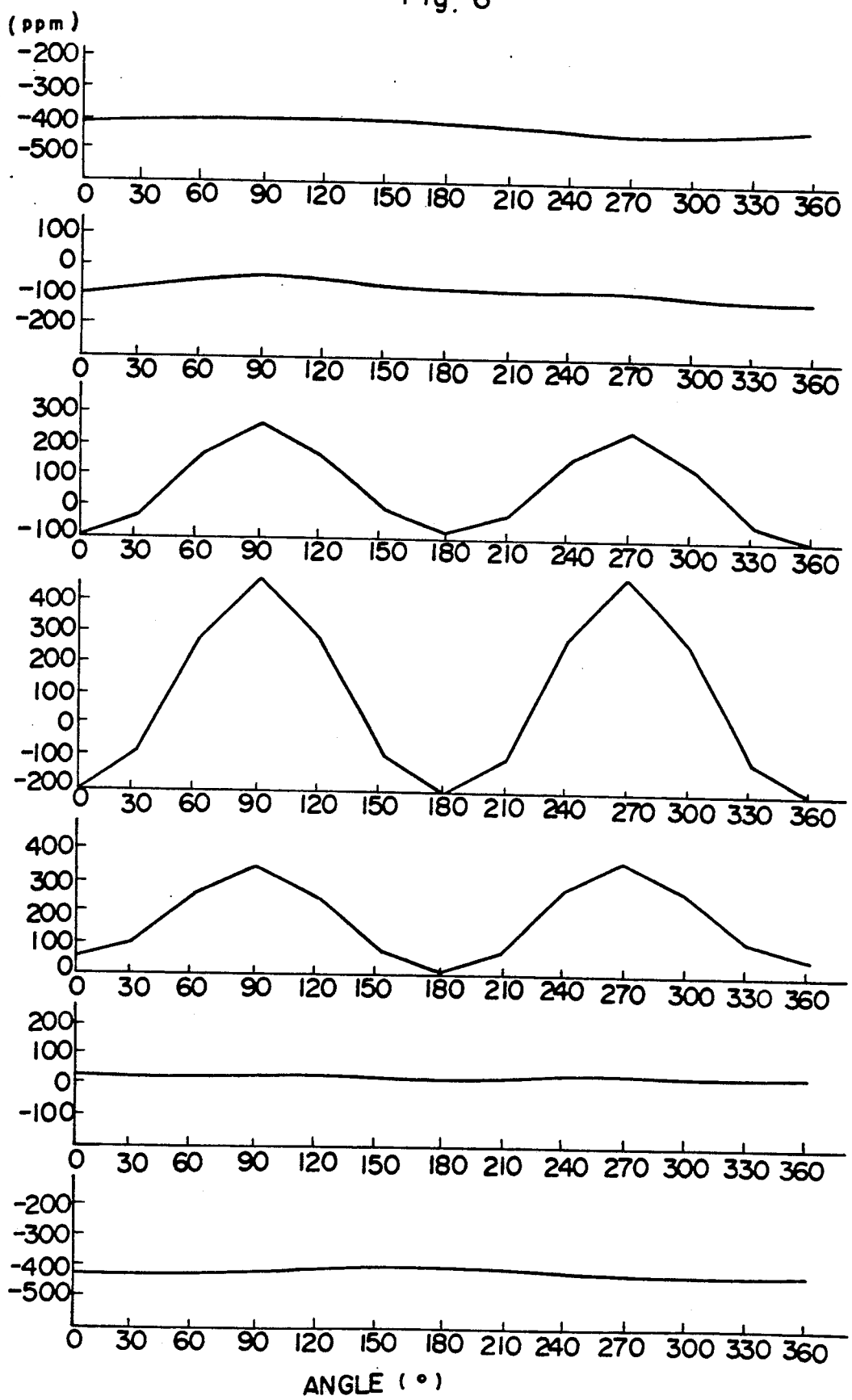
FIG. 6 is a graphic chart similarly showing the measured results of the magnetic fields on the circumferences of the horizontal planes Pa through Pg depicted in FIG. 2, which are expressed by the azimuths and the magnetic field intensities.

Moreover, when measuring the magnetic field intensities on the intersecting circumferences of seven horizontal planes (Pa to Pg) with respect to an air space of a spherical body having a diameter of 350 mm within the air gap (7) while these horizontal planes, as shown in FIG. 2, traverse the air space thereof, the results given in FIG. 6 are obtained.

As is obvious from distributions of intensities of the magnetic fields within the air gaps depicted in FIGS. 4 and 6, the intensity is larger in the Y-axis direction (90°, 270°) than in the X-axis direction (0°, 180°) due to an influence of the retangular yoke.

Based on the distribution of intensities of the magnetic fields within the air space of the spherical body depicted in FIG. 6, the portions for adjusting the magnetic fields on the magnetic pole pieces (2), (2) are determined. Disposed on a concentric circle on each of the magnetic pole pieces (2), (2) are columnar magnetic material segments having a variety of dimensions and made of the same material of the magnetic pole piece or columnar permanent magnet segments having a variety of dimensions and a magnetizing direction opposite to that of the permanent magnet assembly as well as exhibiting the identical characteristics of those of the permanent magnet assembly.

Figure 3:
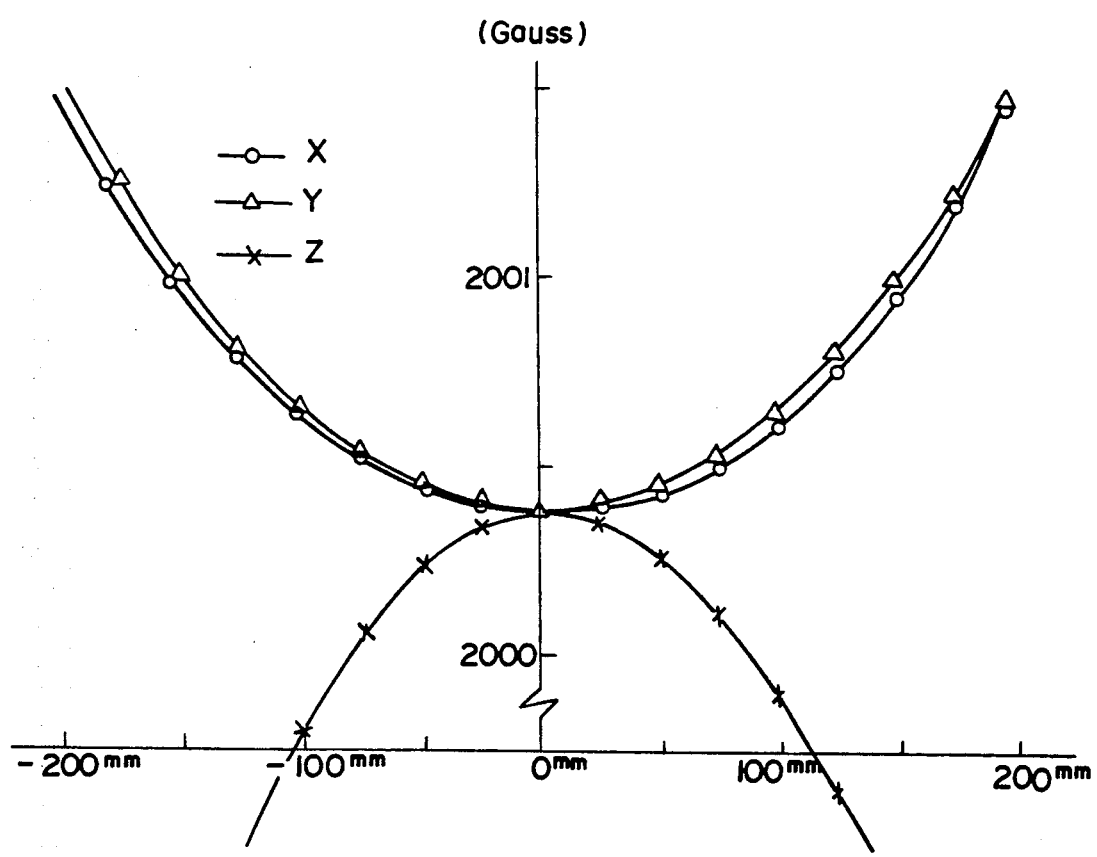
FIG. 3 is a graphic chart showing measured results of the magnetic fields on axes X, Y and Z within the air space of the spherical body, the results being expressed by azimuths and magnetic field intensities.
Figure 5:
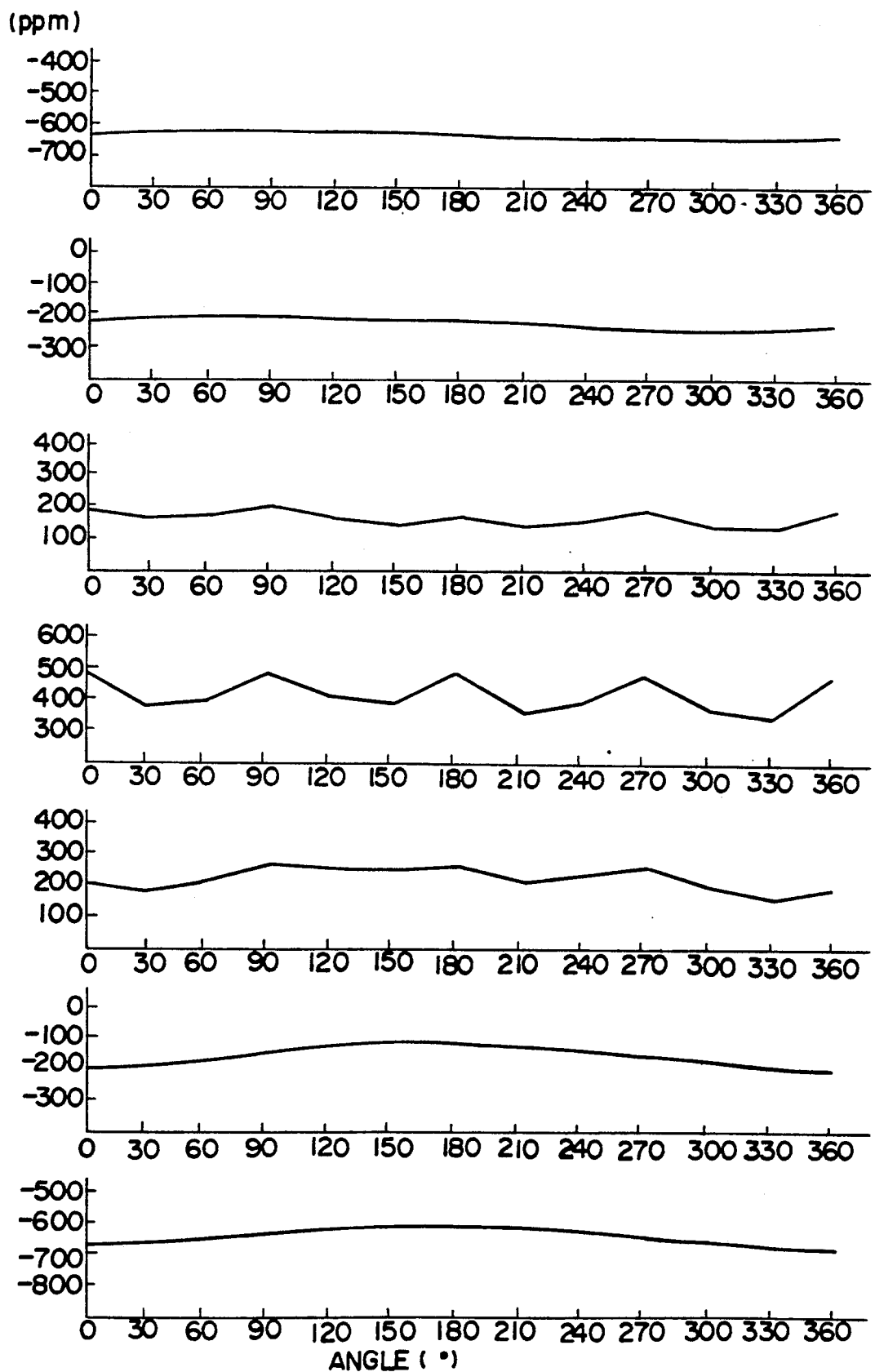
FIG. 5 is a graphic chart similarly showing the measured results of the magnetic fields on circumferences of horizontal planes Pa through Pg, which are expressed by the azimuths and the magnetic field intensities.

When measuring the magnetic field intensities in the directions of the axes X, Y and Z within the air gap (7) of the magnetic field generating device and also the magnetic field intensities on the intersecting circumferences of the horizontal planes with respect to the air space of the spherical body, there are acquired the results shown in FIGS. 3 and 5.

As is obvious from the distribution of the magnetic field intensity shown in FIGS. 3 and 5, the present invention can diminish not only the influence caused by the configuration of the magnetic pole pieces but also the influence caused by the rectangular yoke so that the magnetic field intensity in the air gap can be made more uniform.

Furthermore, a more precise adjustment of the magnetic field is effected by increasing the number of the horizontal planes, as a result of which the uniformity of the magnetic fields within the air space of the spherical body having a diameter of 350 mm can be reduced down to 50 ppm or under.

Although the illustrative embodiments have been described in detail with reference to the accompanying drawings, it is to be understood that the present invention is not limited to those precise embodiments. Various changes or modifications may be effected therein by one skilled in the art without departing from the scope or spirit of the invention.

What is claimed is:

1. A magnetic field-generating device for MRI having a pair of permanent magnet assemblies disposed oppositely with respect to each other to form an air gap therebetween, an object to be examined being inserted into said air gap, yokes for magnetically linking said paired permanent magnet assemblies and a pair of magnetic pole pieces mounted fixedly on the oppositely faced surfaces of the permanent magnet assemblies so that paired magnetic pole pieces are confronting oppositely to each other through said air gap, thereby creating an air space of spherical volume having a uniform magnetic field intensity at the center of said air gap, the improvement in the magnetic field generating device comprising:

a plurality of magnetic elements selected from the group consisting of magnetic material segments and permanent magnet segments for adjusting the magnetic field intensity being located concentrically on each of said magnetic pole pieces to equalize average values of the magnetic field intensity on a plurality of circles defined by horizontally cutting the air spaces of spherical volume, each of the average values of which is obtained by measuring the magnetic field intensity at a plurality of points on a circumference of the same circle each of said magnetic pole pieces to eliminate fluctuations of the magnetic field intensity which are measured at points on each of imaginary circumferences of the outermost circles and a radius of said air space of spherical volume is set to be smaller than a radius of a circle formed by the magnetic elements located on the periphery of the magnetic pole piece.

2. The device as set forth in claim 1, wherein said paired magnetic pole pieces are each provided with a peripheral edge in the form of an annular projection.

3. The device as set forth in claim 2, wherein said annular projection has a trapezoidal or rectangular cross-section.

4. The device as set forth in claim 2, wherein said paired magnetic pole pieces are each provided with a convex surface facing said air gap.

5. The device as set forth in claim 1, wherein said magnetic material segments are in the form of a disk or column.

6. The device as set forth in claim 1, where said permanent magnet segments are disposed to have a magnetic direction opposite to that of said permanent magnet assemblies.

7. The device as set forth in claim 1, wherein said permanent magnet segments are disposed to have a magnetic direction identical with that of said permanent magnet assemblies.

8. The device as set forth in claim 1, wherein said permanent magnet segments are respectively in the form of a disk or column.

9. The device as set forth in claim 1, wherein said magnetic pole pieces include recesses formed on the surfaces of said magnetic pole pieces and said permanent magnet segments are disposed in said recesses, said surfaces facing said air gap.

10. The device as set forth in claim 1, wherein said magnetic material segments and said permanent magnet segments are respectively in the form of a disk or a column.

11. The device as set forth in claim 1, wherein said permanent magnet segments are disposed to have both the magnetic directions opposite to an identical with the magnetic direction of said permanent magnet assemblies.

* * * * *

UNITED STATES PATENT AND TRADEMARK OFFICE
CERTIFICATE OF CORRECTION

PATENT NO. : 5,229,723
DATED : July 20, 1993
INVENTOR(S) : Hideya Sakurai, et al.

It is certified that error appears in the above-indentified patent and that said Letters Patent is hereby corrected as shown below:

On the title page, item (73) Assignee, should read--

Sumitomo Special Metal Co., Ltd.
Osaka, Japan

--.

Signed and Sealed this

Fifteenth Day of March, 1994

Attest:

BRUCE LEHMAN

Attesting Officer

Commissioner of Patents and Trademarks

REEXAMINATION CERTIFICATE (3967th)

United States Patent [19]
Sakurai et al.

[11] B1 5,229,723
[45] Certificate Issued Jan. 4, 2000

[54] MAGNETIC FIELD GENERATING DEVICE FOR MRI

[75] Inventors: Hideya Sakurai; Masaaki Aoki; Youichi Ohnishi, all of Mishima, Japan

[73] Assignee: Sumitomo Special Metal Co. Ltd., Osaka, Japan

Reexamination Request:
No. 90/003,499, Jul. 18, 1994

Reexamination Certificate for:
Patent No.: 5,229,723
Issued: Jul. 20, 1993
Appl. No.: 07/550,081
Filed: Jul. 9, 1990

Certificate of Correction issued Mar. 15, 1994.

[30] Foreign Application Priority Data

Jul. 7, 1989 [JP] Japan .................................. 1-176054

[51] Int. Cl.[7] .................................................. G01R 33/20
[52] U.S. Cl. ............................................................ 324/319
[58] Field of Search ..................... 324/319, 318, 324/322; 128/653.5; 325/299, 296

[56] References Cited

U.S. PATENT DOCUMENTS

4,931,760  6/1990  Yamaguchi ............................. 335/306
4,943,774  7/1990  Breneman et al. ..................... 324/318

FOREIGN PATENT DOCUMENTS

WO8400611  2/1984  WIPO .

Primary Examiner—Louis Arana

[57] ABSTRACT

Disclosed is an MRI-dedicated magnetic field generating device for generating magnetic fields within an air gap, including: a pair of permanent magnet assemblies opposite to each other to form an air gap therebetween; yokes for magnetically linking the permanent magnet assemblies; and magnetic pole pieces fixed to air-gap-confronting surfaces thereof. Based on this construction, intensities of the magnetic fields are increased by disposing a plurality of magnetic material segments on the same circle or a concentric circle on the confronting surface thereof or decreased by disposing a plurality of permanent magnet segments having a magnetizing direction opposite to that of the permanent magnet assemblies on the same circle or the concentric circle on the confronting surface thereof; or alternatively both the magnetic material segments and the permanent magnet segments are disposed on the same circle or the concentric circle.

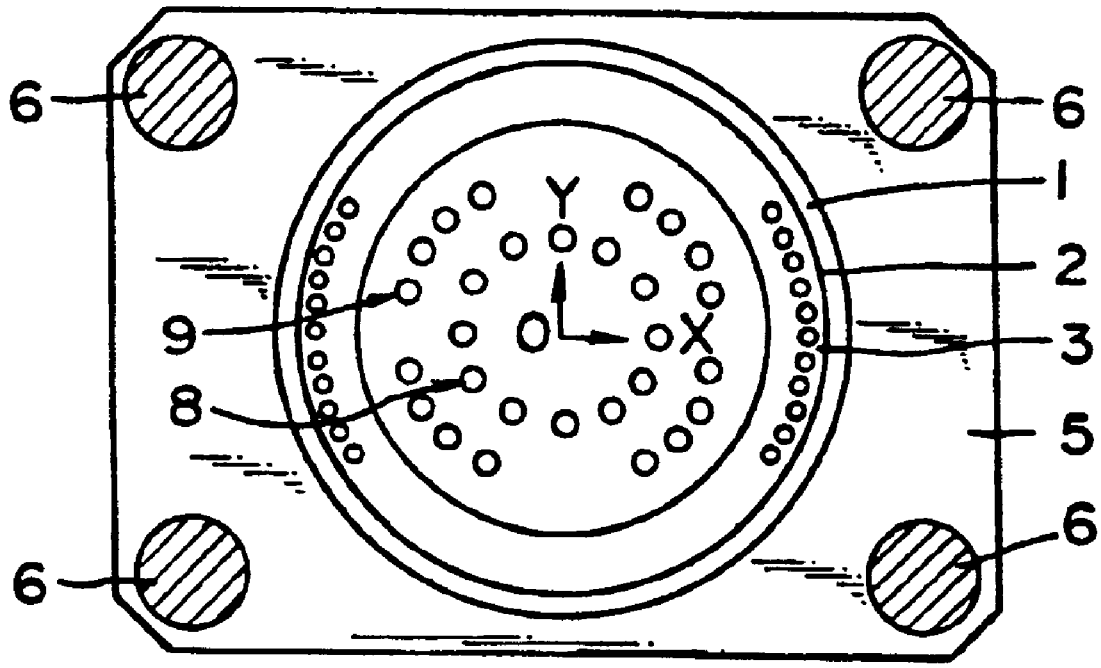

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1–11, are cancelled.

New claims 12–26 are added and determined to be patentable.

*12. A magnetic field generating device for MRI, comprising:*
  *a pair of permanent magnet assemblies disposed opposite one another to form a gap therebetween;*
  *yokes for magnetically linking said pair of assemblies and magnetic pole pieces fixed to air gap-confronting surfaces of said pair of magnet assemblies to generate magnetic fields within said gap, said opposed pole pieces being circular and in symmetry on either side of the gap;*
  *a plurality of magnetic field intensity modifiers comprising at least one of per se known magnetic material segments or permanent magnetic segments, each capable of influencing the magnetic field intensity in the gap and placed at locations on the surface of one or both of the pole pieces for making more uniform the magnetic field intensity in a notational sphere situated symmetrically between the pole pieces within the gap and having a polar axis extending normally between the pole pieces;*
  *at least one of said field intensity modifiers is placed at one selected location on the opposed surfaces of said pair of pole pieces, as a result of measurements taken at a set of measuring locations at the edge of a single plane traversing said notational sphere normally of said polar axis, to determine the lack of uniformity of magnetic field intensity at such measuring locations; and said field intensity modifiers being selected and placed at selected locations on said opposed surfaces of said pole pieces in at leat one circle concentric with said polar axis, said selection and location being calculated to reduce said lack of uniformity of magnetic field intensity in accordance with said set of measurements determined at said measuring locations; and a plurality of sets of measurements are made at measuring locations in a plurality of planes traversing said notational sphere normally of said polar axis, the measurements in each plane constituting a set and all said measuring locations being at the surface of said notational sphere.*

*13. A device according to claim 1, wherein the individual measuring locations of each set of measurements lying in a single latitudinal plane are substantially equispaced from one another at the surface of the notational sphere.*

*14. A device according to claim 1, wherein said planes of said sets of measuring locations are located symmetrically of the equatorial plane of said notational sphere with the polar axis thereof.*

*15. A device according to claim 1, wherein groups of locations at which measurements are made at the surface of the notational sphere have a common longitude but different latitude relative to the polar axis of said notational sphere.*

*16. A magnetic field generating device for MRI, comprising:*
  *a pair of permanent magnet assemblies disposed opposite one another to form a gap therebetween;*
  *yokes for magnetically linking said pair of assemblies and magnetic pole pieces fixed to air gap-confronting surfaces of said pair of magnet assemblies to generate magnetic fields within said gap, said opposed pole pieces being circular and in symmetry on either side of the gap;*
  *a plurality of magnetic field intensity modifiers comprising at least one of per se known magnetic material segments or permanent magnetic segments, each capable of influencing the magnetic field intensity in the gap and placed at locations on the surface of one or both of the pole pieces for making more uniform the magnetic field intensity in a notational sphere situated symmetrically between the pole pieces within the gap and having a polar axis extending normally between the pole pieces;*
  *at least one of said field intensity modifiers is placed at one selected location on the opposed surfaces of said pair of pole pieces, as a result of measurements taken at a set of measuring locations at the edge of a single plane traversing said notational sphere normally of said polar axis, to determine the lack of uniformity of magnetic field intensity at such measuring locations; and said field intensity modifiers being selected and placed at selected locations on said opposed surfaces of said pole pieces in at least one circle concentric with said polar axis, said selection and location being calculated to reduce said lack of uniformity of magnetic field intensity in accordance with said set of measurements determined at said measuring locations; and a total of eighty-four such measurements are made at the surface of said notational sphere, the measurements being made in seven distinct latitudinal planes, with a set of twelve measurements being made in each latitudinal plane.*

*17. A device according to claim 16, wherein said field intensity modifiers are disposed in a plurality of groups on the gap-confronting surfaces of said opposed pole pieces, said groups being in at least one circle substantially concentric about the notational polar axis extending between said opposed pole pieces.*

*18. A device according to claim 16, wherein fluctuations of the magnetic field intensity at the measuring locations at the various planes of said notational spherical space within the gap are reduced by minutely adjusting at least one of the locations and characteristics of selected field intensity modifiers.*

*19. The device as set forth in claim 16, wherein said circular opposed pole pieces are each provided with a convex surface at the central region of the surface of the pole piece confronting said air gap.*

*20. A device according to claim 16, wherein said opposed pole pieces are each provided with a peripheral edge in the form of an annular projection.*

*21. A device according to claim 16, wherein said magnetic field intensity modifiers are in the form of at least one of a disk and column.*

*22. The device according to claim 16, wherein said permanent magnet modifiers are disposed to have a magnetizing direction opposite to that of said permanent magnet assemblies.*

23. The device according to claim 16, wherein said permanent magnet modifiers are disposed to have a magnetizing direction identical with that of said permanent magnet assemblies.

24. The device according to claim 16, wherein said opposed pole pieces include recesses formed on the surfaces of said magnetic pole pieces and said permanent magnet modifiers are disposed in said recesses, said surfaces facing said air gap.

25. The device according to claim 16, wherein some of said permanent magnet modifiers have the magnetizing directions opposite to the magnetizing direction of said permanent magnet assemblies, and some of said permanent magnet modifiers have magnetizing directions identical with the magnetizing direction of said permanent magnet assemblies.

26. A device according to claim 16, wherein each said field intensity modifier effects at least one of an increase or a decrease of the magnetic field intensity in dependence upon at least one of the sets of measurements taken at locations having common latitude at the surface of said notational sphere or upon a group of measurements taken at locations having common longitude at the surface of said notational sphere having said polar axis.

* * * * *